(12) United States Patent
Fagan et al.

(10) Patent No.: US 7,471,132 B2
(45) Date of Patent: Dec. 30, 2008

(54) REDUCED VOLTAGE PRE-CHARGE MULTIPLEXER

(75) Inventors: John L. Fagan, Pasadena, MD (US); Mark A. Bossard, Upper Marlboro, MD (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/559,810

(22) Filed: Nov. 14, 2006

(65) Prior Publication Data

US 2007/0069785 A1      Mar. 29, 2007

Related U.S. Application Data

(62) Division of application No. 10/962,276, filed on Oct. 8, 2004, now Pat. No. 7,157,958.

(51) Int. Cl.
  *H03K 3/017* (2006.01)
(52) U.S. Cl. ........................ 327/172; 327/175
(58) Field of Classification Search ................. 327/172, 327/175
  See application file for complete search history.

(56) References Cited

U.S. PATENT DOCUMENTS

| | | | |
|---|---|---|---|
| 5,594,631 A | 1/1997 | Katoozi et al. | |
| 5,646,558 A | 7/1997 | Jamshidi | |
| 5,701,095 A | 12/1997 | Ohsawa | |
| 5,870,340 A | 2/1999 | Ohsawa | |
| 6,049,231 A | 4/2000 | Bosshart | |
| 6,087,855 A | 7/2000 | Frederick, Jr. et al. | |
| 6,940,328 B2 * | 9/2005 | Lin | 327/175 |
| 7,224,199 B1 * | 5/2007 | Kang | 327/291 |
| 2002/0021151 A1 | 2/2002 | Hirobe | |

\* cited by examiner

*Primary Examiner*—Kenneth B. Wells
(74) *Attorney, Agent, or Firm*—Schwegman, Lundberg & Woessner, P.A.

(57) ABSTRACT

An electronic device selects one of a plurality of input signals for coupling to an output channel. Individual pulldowns provide a separate pathway for each input, and are coupled to a common node which: is pre-charged to a voltage less than a system voltage. Each pulldown is coupled to a select line for gating an associated input signal.

6 Claims, 5 Drawing Sheets

US 7,471,132 B2

REDUCED VOLTAGE PRE-CHARGE MULTIPLEXER

CROSS-REFERENCE TO RELATED APPLICATION

This is a divisional application of pending U.S. patent application Ser. No. 10/962,276 filed Oct. 8, 2004, now issued as U.S. Pat. No. 7,157,958 and incorporated herein by reference in its entirety.

TECHNICAL FIELD

The invention relates to a semiconductor integrated circuit device, and more particularly to a semiconductor integrated circuit device incorporating a multiplexer circuit utilizing a pre-charged node to increase signal throughput speed.

BACKGROUND ART

With respect to FIG. 1, a prior art multiplexer circuit 100, from U.S. Pat. No. 5,701,095 to Ohsawa includes a data selecting circuit 110 and an NMOS pre-charge transistor 120. Input data signals A through D and select signals $\bar{a}$ through $\bar{d}$ (a-bar through d-bar) control the connection of a system supply potential VDD to a common node X providing an output signal $\bar{Q}$ (Q-bar) by biasing the gate terminals of PMOS transistors 2-1 thru 2-4 and 3-1 thru 3-4. The common node X is charged to a system round potential GND by setting a pre-charge signal PRCH high, thereby biasing the NMOS pre-charge transistor 120 into conduction. After completion of the charging operation, the pre-charge signal PRCH goes low, and the common node X floats. The '095 patent discloses a method for setting the input data signals A-D at a level lower than the power supply voltage VDD to speed up transmission of the input data signals A-D to the common node X. However, the '095 patent does not disclose control of the pre-charge potential at the common node X as a method to speed up the transmission of the input, data signals A-D to the common node X.

SUMMARY OF THE INVENTION

Prior art multiplexers suffer from low speeds due to factors such as 1) heavy loading on a common node and 2) depth of stages in a path ("stage depth"). Each of these two factors produces a different type of delay. The heavy loading on a common node causes a select-to-output delay. The stage depth causes an input-to-output delay.

The present invention has a low input to output delay as well as a low select to output delay. The multiplexer is a common line with individual pulldowns for each input. The inputs are each gated by selects. A reduced voltage pre-charge on the common line allows a quick response to a pulldown.

The reduced voltage pre-charge multiplexer of the present invention significantly reduces path delay through a large multiplexer. The multiplexer utilizes a common pre-charge node with input and select gated discharge paths. A pre-charge level is lowered to less than full voltage to further reduce path delay. The lower pre-charge voltage significantly reduces a time required to cause the common node to reach a switching point of the buffered output of the multiplexer.

Additionally the present invention has a reduced stage depth for a given path providing an increased operating speed using a pre-charge/discharge approach to increase the path speed by reducing the load on the common line. The reduced voltage pre-charge significantly increases the operating speed over the pre-charge/discharge approach over the prior art.

DETAILED DESCRIPTION OF THE INVENTION

Figure 1:
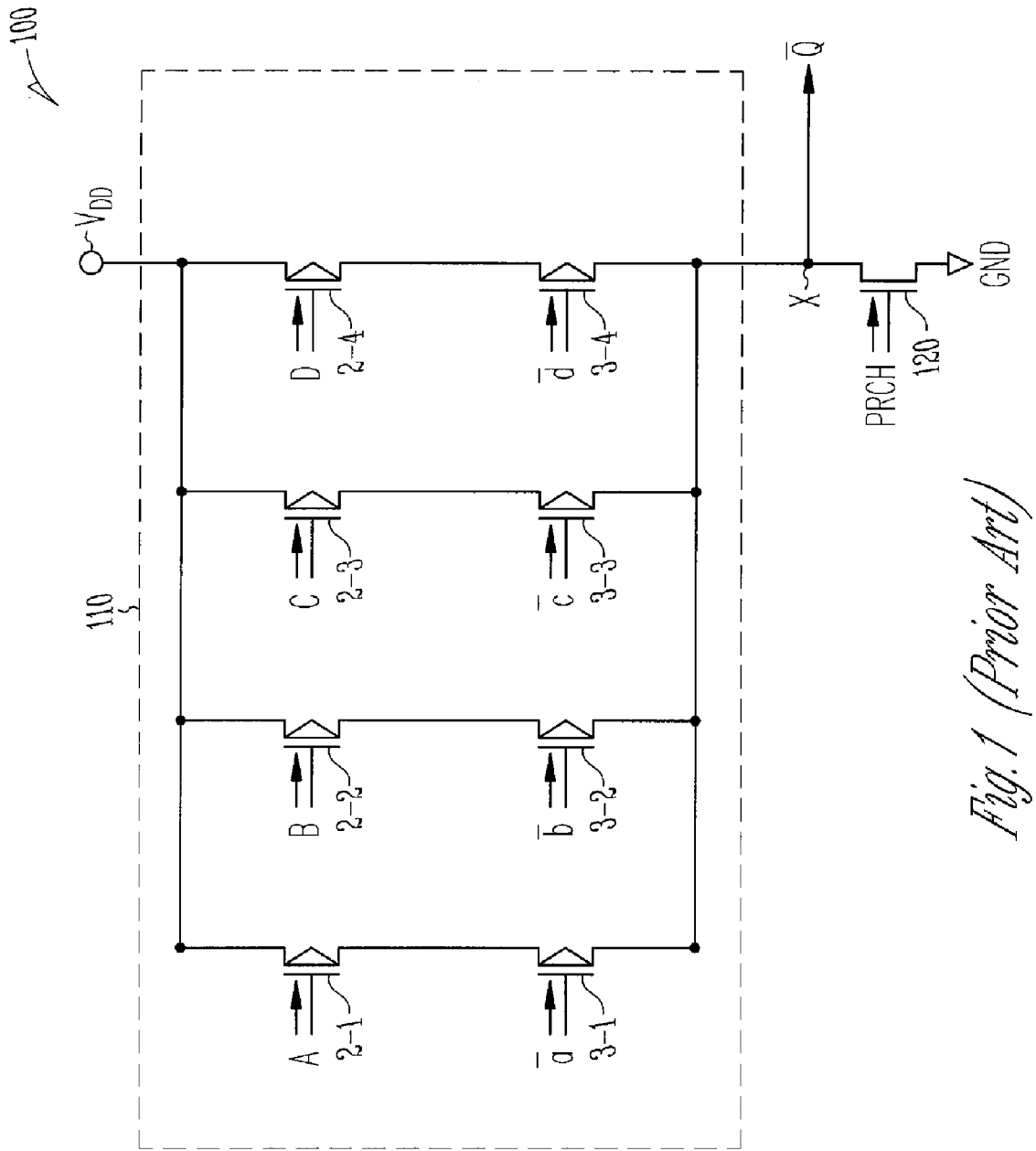
FIG. 1 is a schematic diagram of a multiplexer circuit as known in the prior art.
Figure 2:
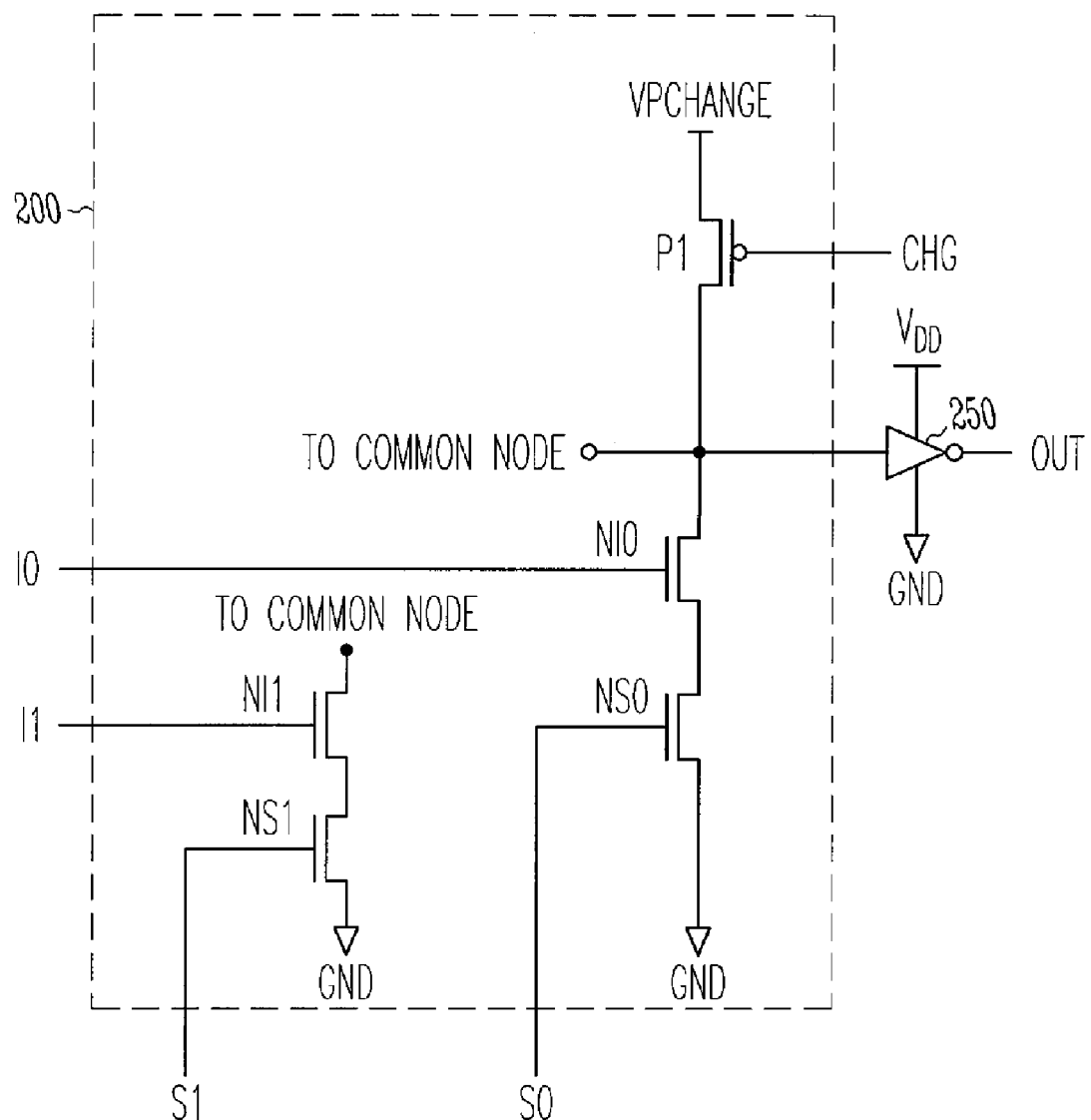
FIG. 2 is a schematic diagram of a multiplexer circuit according to an exemplary embodiment of the present invention.

With reference to FIG. 2, an exemplary embodiments of a low pre-charge voltage multiplexer 200 is comprised of a PMOS pre-charge transistor P1, a first NMOS input transistor NI0, a first NMOS select transistor NS0, a second NMOS input transistor NI1, and a second NMOS select transistor NS1. An input signal I0 is coupled to the gate terminal of the first NMOS input transistor NI0. The drain terminal of the first input transistor N10 is coupled to a common circuit node COMMON. The Source terminal of the first NMOS in put transistor NI0 is coupled to the drain terminal of the first NMOS select transistor NS0. A select signal S0 is coupled to the gate terminal of the first NMOS select transistor NS0. The source terminal of the first NMOS select transistor NS0 is coupled to a system ground potential GND. An input signal I1 is coupled to the gate terminal of the second NMOS input transistor NI1. The drain terminal of the second input transistor NI1 is coupled to the common circuit node COMMON. The source terminal of the second NMOS input transistor NI1 is coupled to the drain terminal of the second NMOS select transistor NS1. A select signal S1 is coupled to the gate terminal of the second NMOS select transistor NS1. The source terminal of the second NMOS select transistor NS1 is coupled to the system ground potential GND.

The PMOS pre-charge transistor P1 has its source terminal coupled to a pre-charge supply potential VPCHG, its gate terminal coupled to a pre-charge control signal CHG, and its drain terminal coupled to the common signal node COMMON. An output buffer 250 has its input terminal coupled to the common signal node COMMON, and its output terminal coupled to output signal OUT. In the exemplary embodiment, the output buffer 250 is an inverter. The output signal OUT produced by the action of the output buffer 250 is the logical inverse of the signal present on the common signal node COMMON. A system supply potential VDD and the system ground potential GND are coupled to the output buffer 250 to provide power for its operation.

It is useful to conceptualize the operation of the low pre-charge voltage multiplexer 200 as having two phases: a pre-charge phase and an evaluate phase.

During the pre-charge phase of the low pre-charge voltage multiplexer 200, both select signals S0 and S1 are held at logic low, preventing conduction in the first input select transistor NS0 and the second input select transistor NS1. The pre-charge control signal CHG is set to logic low, and bases the PMOS pre-charge transistor into conduction. This results in the pre-charge supply potential VPCHG being coupled to the common signal node COMMON. The pre-charge supply potential VPCHG is selected to be less than the system supply potential VDD, but greater than a switchpoint of the output buffer 250. In the exemplary embodiment, the pre-charge supply potential VPCHG is approximately 1.8 volts, and the system supply potential is approximately 2.85 volts. After the potential on the common signal node COMMON reaches approximately the pre-charge supply potential VPCHG, the pre-charge control signal CHG is set to logic high and biases the PMOS pre-charge transistor off, floating the common signal node COMMON. Once charged, the common signal node COMMON remains at approximately the pre-charge supply potential VPCHG until discharged, to be explained infra.

During the evaluate phase of operation, one of select signals S0 and S1 is set to logic high, thereby enabling the associated input signal (I0 and I1 respectively to control a discharge path for the common node COMMON through the NMOS input transistor NI0 and NI1. For example, assume S0 is set to logic high, biasing the first NMOS select transistor NS0 into conduction. The state of the common signal node COMMON now depends on a value of the input signal I0. If the input signal I0 is at logic high, then the first NMOS input transistor NI0 is biased into conduction. The series combination of the first NMOS select transistor NS0 and the first NMOS input transistor NI0 provides at path for the discharge of the common signal node COMMON, altering its condition to a logic low. The logic low is then inverted by the output buffer 250 to a logic high on output signal OUT which matches the input signal I0. The reduced pre-charge voltage significantly reduces the time required to cause the common signal node COMMON to reach the switching point of the output buffer 250, by allowing a fast response to the pull-down. Overall, the speed gain is dependent on how close the pre-charge supply potential VPCHG is to the switching point of the output buffer 250.

If the input signal I0 is logic low during the evaluation phase of the circuit operation, no pulldown of the common signal node COMMON occurs. The common signal node COMMON remains at logic high, and the output signal OUT remains at logic low, matching I0. The output signal OUT can conceptually be considered to match the input signal I0 with a small propagation time delay.

Those skilled in the art will readily recognize that the number of signals processed by the low pre-charge voltage multiplexer 200 may be increased by the instantiation of additional series combinations of an NMOS input transistor with an associated NMOS select transistor, extending the circuit illustrated in FIG. 2.

In an alternate embodiment of the present invention, an alternative NMOS pre-charge transistor may be substituted for PMOS pre-charge transistor P1, the alternative NMOS pre-charge transistor having its source terminal coupled to the system supply potential VDD, its drain terminal coupled to the common signal node COMMON, and its gates terminal coupled to the pre-charge control signal CHG. A voltage reduction of approximately one diode potential (about 0.6 to 0.7 volts) would be produced by the NMOS device so configured, resulting in the desired reduction in the pre-charge potential present on the common signal node COMMON. The logical polarity of the pre-charge control signal CHG controlling the NMOS operation would be inverted with respect to the case of PMOS pre-charge transistor by means readily known to those skilled in the art, to provide an appropriate on/off function by the NMOS transistor.

Figure 3:
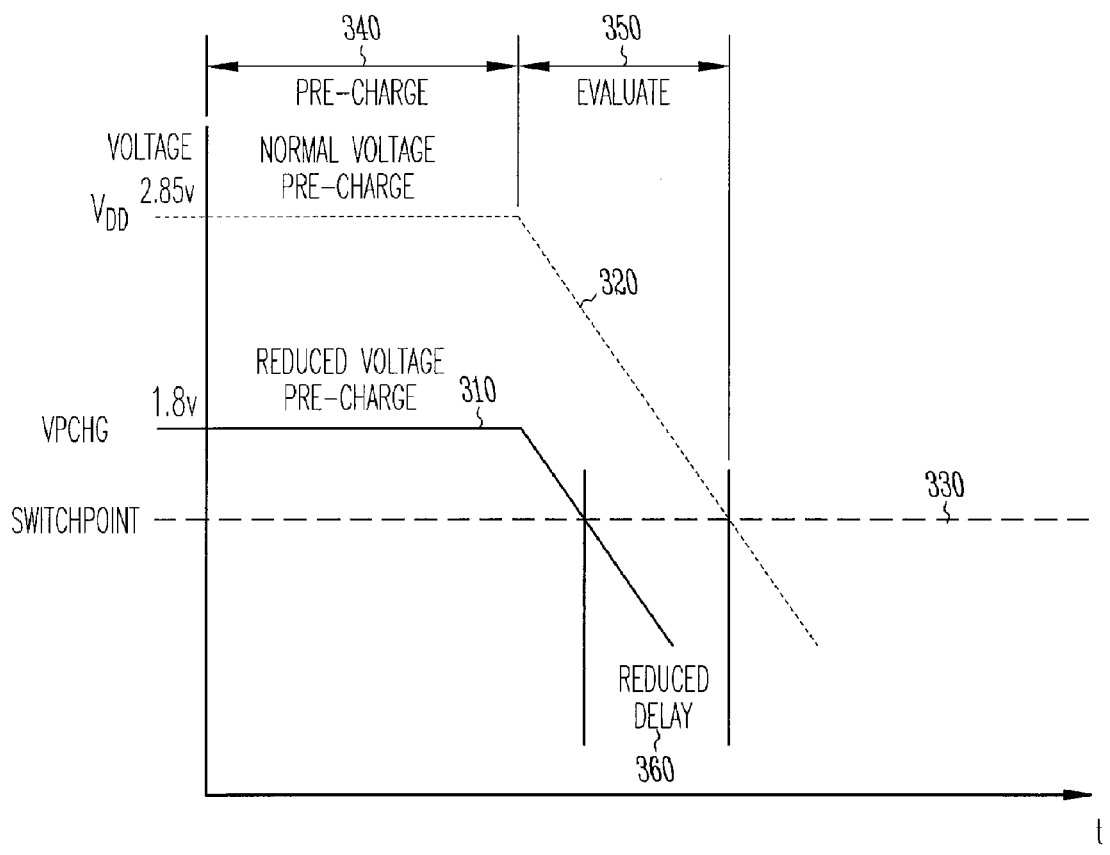
FIG. 3 is a voltage-time graph comparing signals propagated under the prior at and in accordance with the exemplary embodiment of FIG. 3.

With reference to FIG. 3, a voltage-time graph compares the performance of the present invention with a multiplexer design based on the prior art. A reduced voltage pre-charge curve 310 represents the time vs. voltage behavior of the common signal node COMMON for a multiplexer according to the exemplary embodiment, of the present invention. A normal voltage pre-charge curve 320, represents the time vs. voltage behavior of the common signal node COMMON, where the pre-charge voltage is equal to the system supply potential VDD, in accordance with the prior art. A switchpoint potential line 330 represents a threshold level at which the output buffer 250 switches logic states. During a pre-charge interval 340, both pre-charge curves remain constant at their initial values. However, during an evaluate interval 350, the pre-charge curves decrease as time progresses. The points where the reduced pre-charge curve 310 and the normal pre-charge curve 320 cross the switchpoint potential line 330 determines when the multiplexer output transitions to its desired value. The difference between the crossing points is given by a reduced delay interval 360 which represents the performance improvement associated with the present invention.

Figure 4:
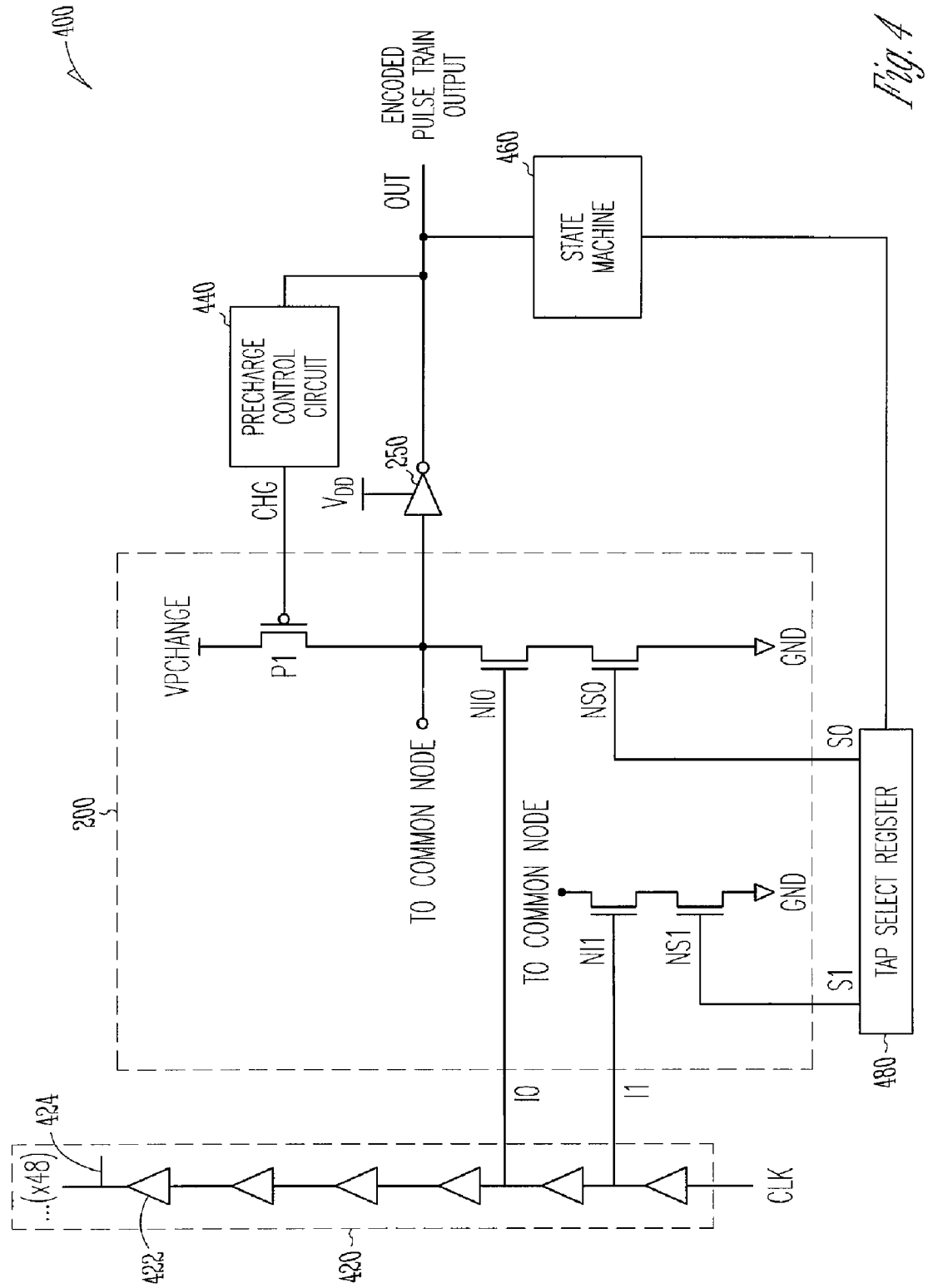
FIG. 4 is a schematic diagram of an exemplary embodiment of a pulse width modulator (PWM).

FIG. 4 is a schematic diagram of an exemplary embodiment of a pulse width modulator (PWM) 400 circuit utilizing the present invention. The pulse width modulator 400 is comprised of the low pre-charge voltage multiplexer 200, a current controlled delay chain 420, a state machine 460, a tap select register 480, a pre-charge control circuit 440, and the output buffer 270. The current controlled delay chain 420 is further comprised of a plurality of clock delay elements 422 and associated clock delay chain taps 424. The clock delay elements 422 may be any of a plurality of signal delay configurations known to those skilled in the art, one example of which is two inverters connected in series. In the exemplary embodiment, each of the clock, delay elements 422 and the associated lock delay chain taps 424 are instantiated 48 times and connected in series to produce multiple values of delay as a clock signal clk propagates through the current controlled delay chain 420. Only a portion of the 48 instantiations are shown for the sake of clarity.

Each of the 48 instances of the delay chain taps 424 is coupled to an input signal terminal of the low pre-charge voltage multiplexer 200. In FIG. 4, only the input signal I0 and the input signal I1 couplings are shown to avoid obscuring the essential features of the present invention. State machine 460 is coupled to an encoded pulse train output terminal and to the tap select register 480. The tap select register 480 is coupled to the select signal terminals. In FIG. 4, on the select signal S0 and the select signal S1 are shown, but in actuality one select signal is associated with each input signal terminal. Based on a value of the encoded pulse train output, the state machine 460 configures the tap select register 480 to select one specific select signal out of the 48 instantiations which enables the associated input signals providing a desired delay of the clock signal clk. Arrival of the delayed clock at the specific select signal enables discharge of the common signal node COMMON, resulting in propagation of the delayed clock to the output signal OUT.

The pre-charge control circuit 440 is coupled to the encoded pulse train output and to the pre-charge control node CHG. In the exemplary embodiment, the pre-charge control circuit 440 is a simple delayed inversion and feedback of the multiplexer circuit output signal OUT. In operation, a rising edge signal on the output, signal OUT causes the state machine 460 to advance the specific select signal selected by the tap select register 480, breaking the discharge path and triggering the pre-charge process. The initiation of the pre-charge process raises the potential on the common signal node COMMON, returning the output signal OUT to a logic low and prepares the pulse width modulator (PWM) 400 circuit for the arrival of the delayed clock at the next selected tap. The signal on output signal OUT produced in this manner is termed a self-timed clock pulse. Those skilled in the art will readily recognize that the self-timed clock pulse need only be wide enough to advance the tap select register.

Figure 5:
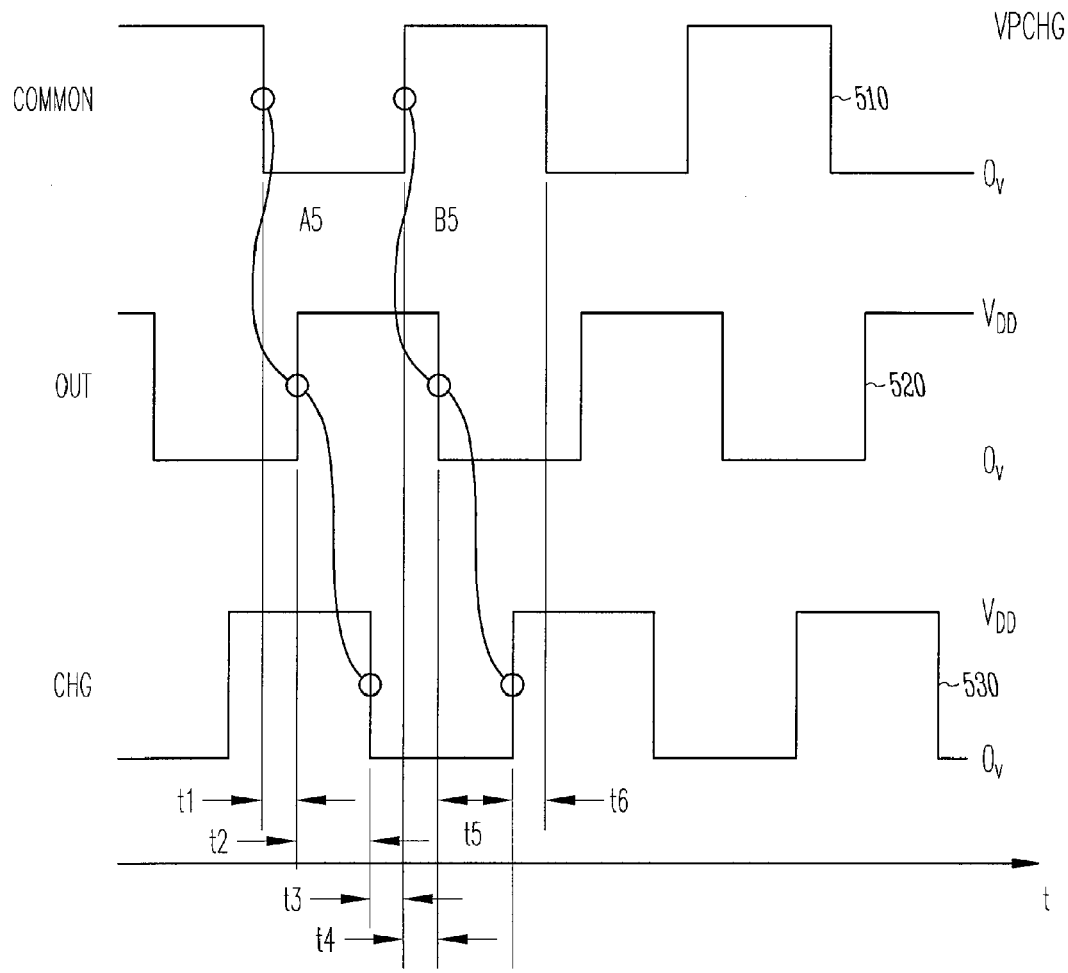
FIG. 5 is a timing diagram illustrating the operation of a pre-charge control circuit according to the present invention.

With reference to FIG. 5, a timing diagram of the pre-charge control circuit 440 according to the present invention is comprised of a common signal node timing curve 510, an output signal node timing curve 520, and at pre-charge control signal timing curve 530. At event A5, the common signal node COMMON, initially charged to pre-charge supply potential VPCHG, is pulled to a logic low during the evaluate phase of the low pre-charge voltage multiplexer 200 operation. As a result after a time period t1 associated with a propagation delay through the output buffer 250, the output signal OUT transitions from logic low, to logic high. Note that the value of logic high associated with the output signal node timing curve 520 is the system supply potential VDD. This is because the output buffer 250 is powered by the system supply potential VDD and system ground potential GND and has a logic swing which spans the potential difference between these supply potentials. The output signal OUT is inverted and delayed by the pre-charge control circuit 440 for a time period t2, causing the pre-charge control signal CHG to transition to logic low. This causes PMOS pre-charge transistor P1 to be biased into conduction, initiating the charging process on the common signal node COMMON by coupling COMMON to the pre-charge supply potential VPCHG. Those skilled in the art will readily recognize that the signal inversion is necessary due to the operating characteristics of the PMOS transistors, which cause them to enter conduction when their gate terminals are biased at logic low, and which further cause them to be off when their gate terminals are biased at logic high. After a time period t3, the common signal node COMMON charges to the pre-charge supply potential VPCHG. At event B5, the rising edge of the common signal node COMMON causes the output signal OUT to transition to logic low after a time period t4 associated with the propagation delay through the output buffer 250. The output signal OUT is inverted and delayed by the pre-charge control circuit 440 for a time period t5, causing the pre-charge control signal CHG to transition to logic high. This causes PMOS pre-charge transistor P1 to be shut off. The common signal node COMMON is allowed to float, remaining at the pre-charge supply potential VPCHG. The common signal node COMMON continues to float for a time period t6. At the end of time period t6, the common signal node COMMON is pulled to logic low, restarting the process which began at event A5.

A novel point in the operation of the pre-charge control circuit 440 as evidenced by inspection of the common signal node timing curve 510, the output signal timing curve 520, and the pre-charge control signal timing curve 530, is that the pre-charge timing is automatically generated from the outputs OUT of the pulse width modulator (PWM) 400.

In the foregoing specification, the present invention has been described with reference to specific embodiments thereof. It will, however, be evident that various modifications and changes can be made thereto without departing from the broader spirit and scope of the present invention as set forth in the appended claims. For example, in the exemplary embodiment, only one select is allowed to be active (high) at a time. However, other embodiments are envisioned where more than one select could be active at a time. The specification and drawings are accordingly, to be regarded in an illustrative rather than a restrictive sense.

The invention claimed is:

1. An electronic pulse width modulator circuit operating from a system supply voltage and having an output terminal, the circuit comprising:
   a multiplexer having select terminals, input terminals, a common pre-charge node, and a pre-charge device configured to provide a voltage for the common pre-charge node, the voltage being less than the system supply voltage;
   a state machine coupled to the output terminal and to a tap select register, the tap select register further coupled to the multiplexer select terminals;
   a clock delay chain having a plurality of delay chain elements and delay chain taps, each delay chain tap coupled to one of the input terminals; and
   a pre-charge control circuit coupled to the pre-charge device and to the output terminal, the pre-charge control circuit being configured to operate by delaying an output signal from the output terminal, adjusting the logic polarity of the delayed output signal, and coupling the delayed and adjusted output signal to the pre-charge device.

2. The electronic pulse width modulator of claim 1, wherein the state machine advances a select signal controlled by the tap select register in response to a rising edge on the output terminal.

3. An electronic pulse width modulator circuit operating from a system supply voltage and having an output terminal, the circuit comprising:
   a multiplexer having select terminals, input terminals, a common pre-charge node, and a pre-charge device configured to provide a voltage for the common pre-charge node, the voltage being less than the system supply voltage;
   a state machine coupled to the output terminal and to a tap select register, the tap select register further coupled to the multiplexer select terminals, wherein the state machine advances a select signal controlled by the tap select register in response to a rising edge on the output terminal, causing a pulldown of the common pre-charge node to terminate;
   a clock delay chain having a plurality of delay chain elements and delay chain taps, each delay chain tap coupled to one of the input terminals; and
   a pre-charge control circuit coupled to the pre-charge device and to the output terminal, the pre-charge control circuit being configured to operate by delaying an output signal from the output terminal, adjusting the logic polarity of the delayed output signal, and coupling the delayed and adjusted output signal to the pre-charge device.

4. A method for applying a controlled voltage to a common signal node, the method comprising:
   in a pulse width modulator having a system voltage, coupling the controlled voltage to the common signal node by means of a pre-charge transistor, the controlled voltage being less than the system voltage; and
   coupling a delayed and logically adjusted output signal of the pulse width modulator to a gate terminal of the pre-charge transistor, wherein a delay applied to the output signal is based on a plurality of delay chain elements and selectable delay chain taps.

5. A method of creating a self-timed clock pulse in a pulse width modulator circuit operating from a system supply voltage and having an output terminal, the method comprising:

coupling the output terminal to a common node by means of a buffer circuit operating from the system supply voltage;

pre-charging the common node to a voltage less than the system supply voltage;

discharging the common node by a pulldown in response to one of a plurality select signals and a plurality of delayed clock pulses;

advancing the select signal in response to an edge of a signal on the output terminal, thereby terminating the pulldown of the common terminal;

initiating the pre-charging of the common node in response to the edge of the signal on the output terminal; and terminating the pre-charge of the common node in response to an edge of the signal on the output terminal of opposite direction to the edge of the signal on the output terminal initiating pre-charge of the common node.

6. The method of claim 5 wherein the edge of the signal on the output terminal responsible for advancing the select signal and initiating the pre-charge of the common node is a rising edge, and the edge of the signal on the output terminal terminating the pre-charge of the common node is a falling edge.

* * * * *